(12) United States Patent
Liu et al.

(10) Patent No.: US 7,358,184 B2
(45) Date of Patent: Apr. 15, 2008

(54) METHOD OF FORMING A CONDUCTIVE VIA PLUG

(75) Inventors: Chien-Hung Liu, Hsinchu (TW); Ming-Huan Yang, Hsinchu (TW); Jane Chang, Hsinchu (TW); Chun-Jung Chen, Hsinchu (TW); Chao-Kai Cheng, Hsinchu (TW); Kou-Chen Liu, Taoyuan (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/819,137

(22) Filed: Apr. 7, 2004

(65) Prior Publication Data

US 2005/0142871 A1 Jun. 30, 2005

(30) Foreign Application Priority Data

Dec. 26, 2003 (TW) ............................. 92137214 A

(51) Int. Cl.
*H01L 21/44* (2006.01)
(52) U.S. Cl. .................. 438/672; 438/98; 438/453; 438/584; 438/597; 438/669; 438/689; 438/695; 216/17; 216/18
(58) Field of Classification Search .................. 438/98, 438/453, 584, 597, 669, 672, 689, 695; 216/17, 216/18
See application file for complete search history.

(56) References Cited

U.S. PATENT DOCUMENTS

| 5,976,393 A | * | 11/1999 | Abe ............................ 216/18 |
| 6,270,389 B1 | * | 8/2001 | Kobayashi et al. ............ 445/24 |
| 2003/0059987 A1 | * | 3/2003 | Sirringhaus et al. ......... 438/149 |
| 2003/0107044 A1 | * | 6/2003 | Kubota et al. ................. 257/79 |

\* cited by examiner

*Primary Examiner*—Zandra V. Smith
*Assistant Examiner*—Bac H. Au
(74) *Attorney, Agent, or Firm*—Birch, Stewart, Kolasch & Birch, LLP

(57) ABSTRACT

A method of forming a conductive via plug is disclosed. The conductive via plug is formed by printing a solution comprising a solvent with insulating material dissolve capability and a conductive material by an inkjet method. The formed conductive via plug has a low resistivity and thus may serve as an electrical connection between two separate conductive layers. This manufacturing method of the conductive via plug may achieve simultaneously deposition, patterning and etching purposes, which significantly simplifies the manufacturing process.

8 Claims, 6 Drawing Sheets

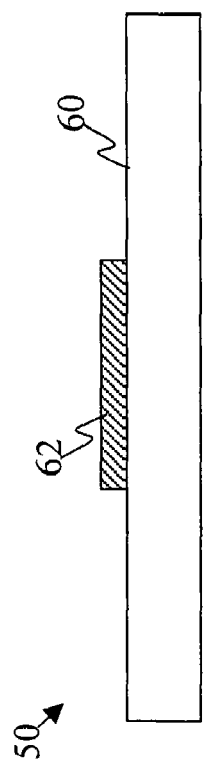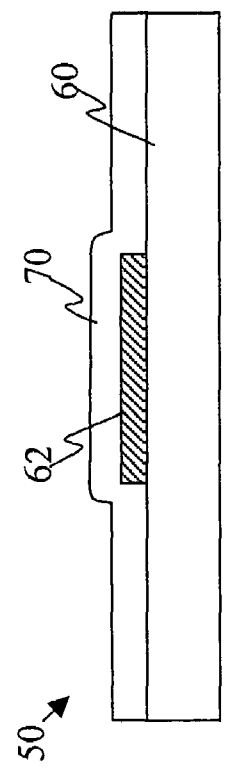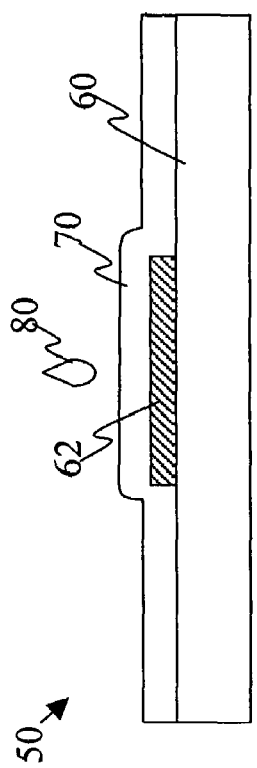

METHOD OF FORMING A CONDUCTIVE VIA PLUG

This Non-provisional application claims priority under 35 U.S.C. §119(a) on Patent Application No(s). 092137214 filed in Taiwan on Dec.26, 2003, the entire contents of which are hereby incorporated by reference.

BACKGROUND OF THE INVENTION

1. Field of Invention

The present invention is related to a method of forming a conductive via plug and particularly to a method of forming the conductive via plug by use of inkjet with etching and depositing proceeding simultaneously.

2. Related Art

For a long time, a deposition-lithography-etching operation has been the primary process for manufacturing of conventional printed circuit boards (PCBs), semiconductor devices, flat displays and integrated circuits (ICs). For the first used deposition process, chemical vapor deposition (CVD) or physical vapor deposition (PVD) such as evaporating or sputtering is used for generating a blanket deposition. Next, exposure and photoresist develop processes are undertaken for the deposited layer to cause a desired photoresist left pattern. Next, a wet etching or a dry etching is exercised on the left pattern to obtain a desired layer pattern.

This process concept has long been used in IC and flat panel display manufacturing, and often ten and more times of repeat of the deposition-lithography-etching must be repeated ten times or more for a finished production. The finished product has reliable physical and electrical characteristics, but the costs of manufacturing process and the corresponding equipment are high. In recent years, many printing methods have been developed, in an attempt to print desired layers by outputting patterning deposition. For instance, H. Gleskova et al. used electro-photographic printing carbon powder on the photoresist to supercede the conventional exposure. W. S. Wang et al. used an acoustic inkjet to print wax material, to take the place of the lithography. Evenly, C. M. Hong et al. printed golden, silver, copper particles, etc. by the inkjet method to produce a conductive drain/source of a thin film transistor (TFT). Further, S. B. Fuller et al. utilized nano particles to manufacture lines of an actuator.

However, the printing method has a poorer resolution or a non-uniform or unrefined line width. For both the TFT and PCB applications, reducing manufacturing process and its equipment can be the most significant issue and a simplified process issue is required. In the multilevel interconnect case in the TFT and PCB applications, the manufacturing process is yet much more complex than in the general line printing. In this case, a via hole between the different conductive layers needs to be connected and the printing for an isolator between the different conductive layers is more complex. In the current literature, the multilevel interconnect is described according to two methods. One is to print a polyketone resin with a thickness of 40 μm at a first and a second conductive layer to isolate the two conductive layers, where a silver particles solution is used as the conductive layer. The other is provided by Takeo Kawase et al., where a 500 nm PVP (poly-vinyl pheonl) is used to totally cover a first conductive layer, then a soluble PVP is printed by the inject method to etch out a via, and then a second conductive layer is printed. The first and second conductive layers are made of organic polymers which have a much greater resistivity than silver particles. At the same time, a via hole between the two conductive layers has a resistivity of 0.5 MΩ order.

SUMMARY OF THE INVENTION

The present invention is aimed at the process and conductivity problems of the prior conductive layer.

To tackle the problems in the prior art, the present invention provides a process of forming a conductive via plug, which prints a solution comprising a solvent with dissolving insulating material capability and a conductive material by an inkjet method to etch through the insulating material to form a conductive via plug.

The method of forming a conductive via plug according to the present invention comprises the steps of providing a substrate; forming a conductive layer over said substrate; forming an insulating layer over said conductive layer; providing a solution comprising a solvent and a conductive material; printing said solution on an upper surface of said insulating layer by an inject method and forming a via hole by etching said insulating layer by said solvent; removing said solvent and forming a conductive via plug by depositing said conductive material; and forming another conductive layer over said insulating layer and said conductive via plug and said conductive via plug serving as an electrical connection between said conductive layer and said another conductive layer.

The method of forming a conductive via plug according to the present invention comprises the steps of providing a substrate; forming a gate over said substrate; forming an insulating layer over said substrate and said gate; providing a solution comprising a solvent and a conductive material; printing said solution on an upper surface of said insulating layer by an inject method and forming a via hole by etching said insulating layer to said gate by said solvent; removing said solvent and forming a conductive via plug by depositing said conductive material; and forming a source and a drain and coating a semiconductor material over said insulating layer and said conductive via plug serving as an electrical connection respectively between said gate and said source and between said gate and said drain.

According to the manufacturing method of the present invention, since the resistivity of the metal particles printed is merely 5 to 10 times the aluminum bulk, which is far lower than that obtained by the combination of organic polymers and PVP via hole process like in the prior literature, a multilevel interconnect is formed. The inventive method is incorporated to use in wider linear width applications, micro-level and up, such as in PCB or TFT manufacturing. Since the deposition-lithography-etching process is replaced, the process becomes more simply and the multilevel interconnect structure better conductivity.

To better describe the purposes, features and functions, the present invention will be explained in detail in connection with the drawings.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow for illustration only, and thus is not limitative of the present invention:

FIG. 6 to FIG. 10 illustrate a flow chart of an SED method of manufacturing a thin film transistor (TFT) according to the present invention;

DETAILED DESCRIPTION OF THE INVENTION

The present invention sets forth a solution having a solvent with insulating material dissolve capability and conductive particles, and prints the solution by an inkjet method at a location where a conductive via plug is to be formed. The solvent of the solution etches through an insulating material and the conductive particles of the solution form a conductive via plug when the solvent dries. This method is named 'spontaneously-etched deposition' (referred hereafter as SED).

Figure 11:
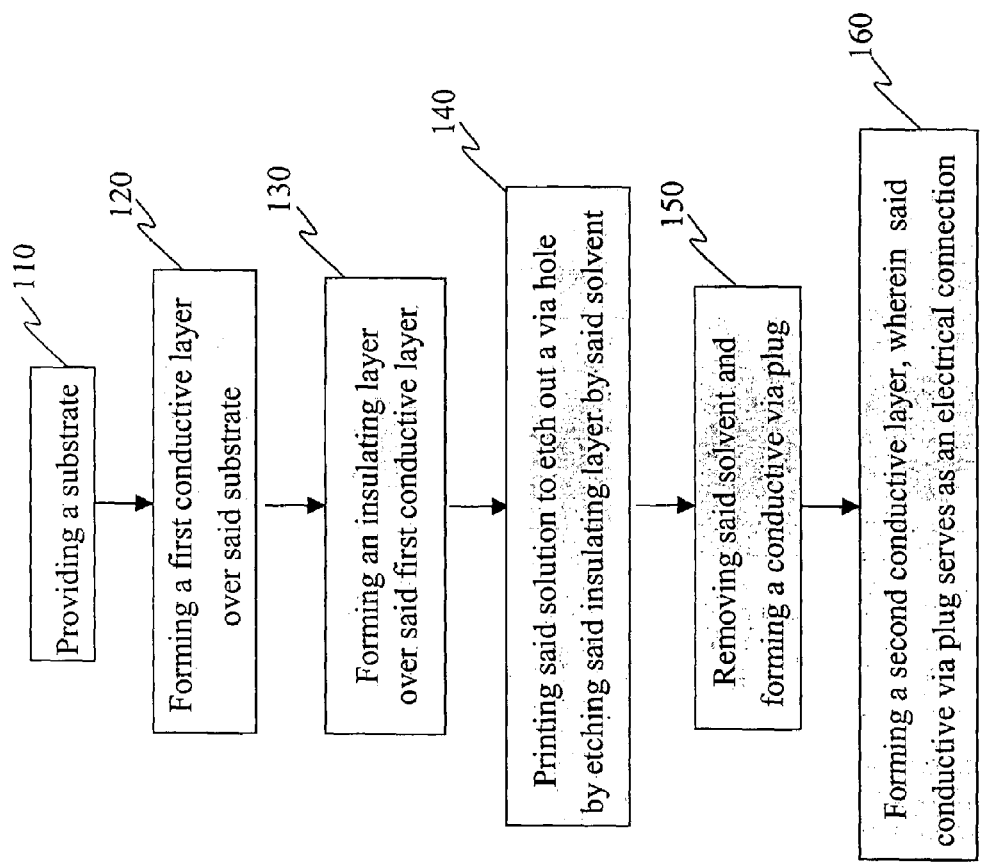
FIG. 11 illustrates a flow chart of an SED method of manufacturing a multilevel interconnect structure according to the present invention.

Referring to FIG. 11, a flow chart of manufacturing a multilevel interconnect structure by the inventive SED method is illustrated therein, which comprises the steps of providing a substrate (step 110); forming a first conductive layer over said substrate (step 120); forming an insulating layer over said first conductive layer (step 130); printing said solution to etch out a via hole by etching said insulating layer by said solvent (step 140); removing said solvent and forming a conductive via plug (step 150); and forming a second conductive layer, wherein said conductive via plug serves as an electrical connection (step 160).

The followings is an illustration of the method.

Figure 1:
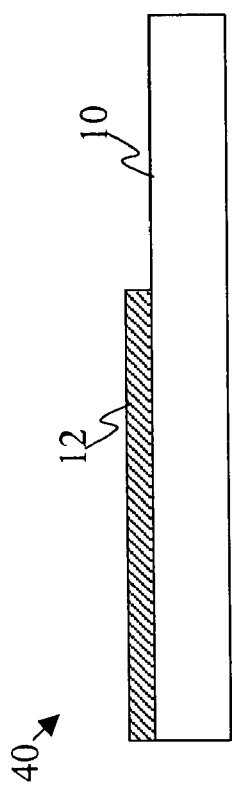
FIG. 1 to FIG. 5 illustrate a flow chart of an SED method of manufacturing a multilevel interconnect according to the present invention.

The first step is to provide a substrate. As shown in FIG. 1, a silicon semiconductor substrate 10 is provided.

Next, a first conductive layer is formed on the substrate. In the step, a first conductive layer 12 is directly printed on the substrate 10 by using a silver particles metal line aqueous solution, using a thermal bubble-jet printing method. Next, the first conductive layer 12 is baked at a temperature of 230° C.

Figure 2:
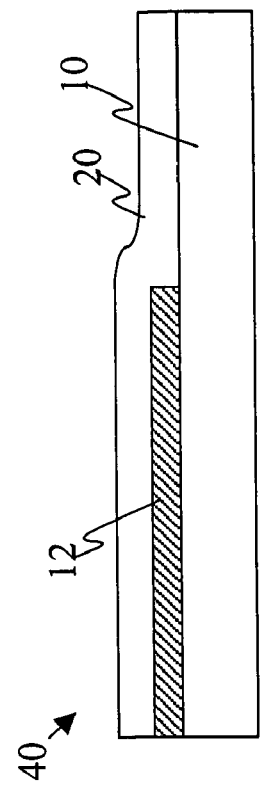

An insulating layer is formed on the first conductive layer. As shown in FIG. 2, a photoacryl organic solution is coated on the first conductive layer 12 by spin coating. After a 5 minute soft bake at 90~120° C., the insulating layer 20 is formed. The insulating layer 20 is formed by an organic solid material and has a resistiviy over 10 times that of the first conductive layer 12.

Figure 3:
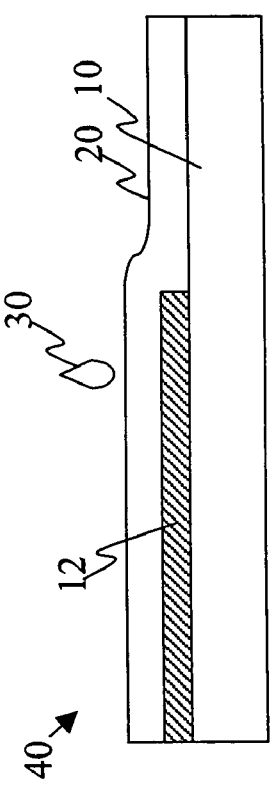

The solution is printed and used to etch the insulating layer to form a via hole. As shown in FIG. 3, a solution 30 having an organic solution and conductive material is printed on an upper surface of the insulating layer 20 using a printing method, to form the via hole. In the solution, the organic solvent is acetone and anisole, which are used to etch the insulating layer 20 obtained from the photoacryl organic solution, and the conductive material has nano-paste Ag particles with their diameters not more than 5 micro meters obtained from Harima.

Figure 4:
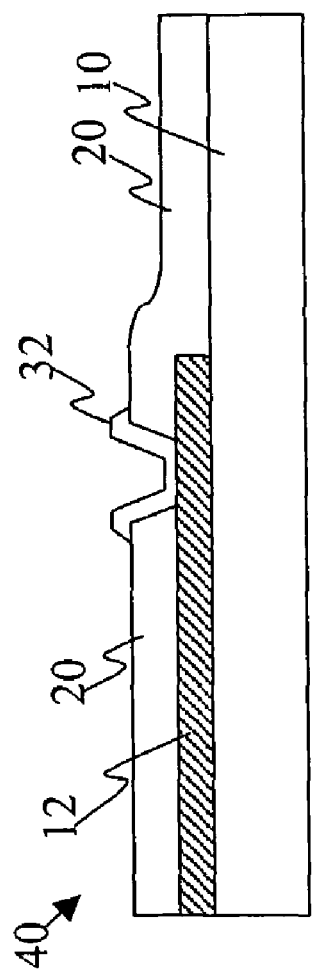

Next, the solvent is removed and a conductive via plug is formed. In FIG. 4, the conductive via plug 32 is formed, which is the solution 30 after the etch through the insulating material 20, a main bake of 1 hour at 230° C. and a solidification of the conductive material and the insulating layer dissolved. The thus formed insulating layer 20 has a resistivity over 10 times that of the conductive via plug 32.

Figure 5:
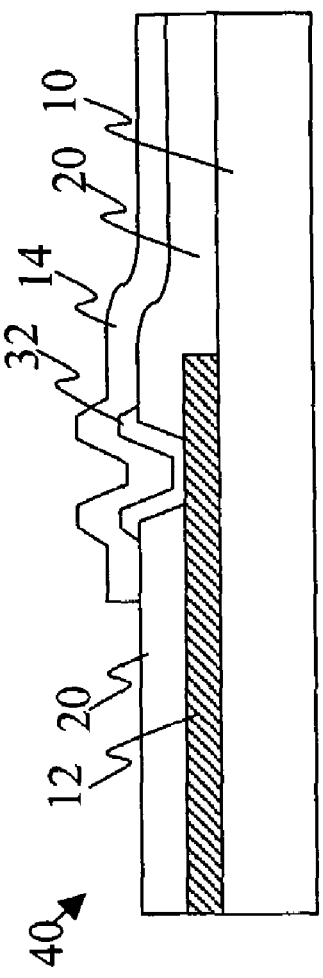

Next, a second conductive layer is formed and the conductive via plug is served as an electrical connection (step 160). As shown in FIG. 5, silver particles metal lines aqueous solution are printed over the insulating layer 20 and the conductive via plug 32 to form a second conductive layer 14. In this case, a two-level line structure is obtained and the conductive via plug 32 serves as the electrical connection between the two conductive layers 12, 14.

Figure 12:
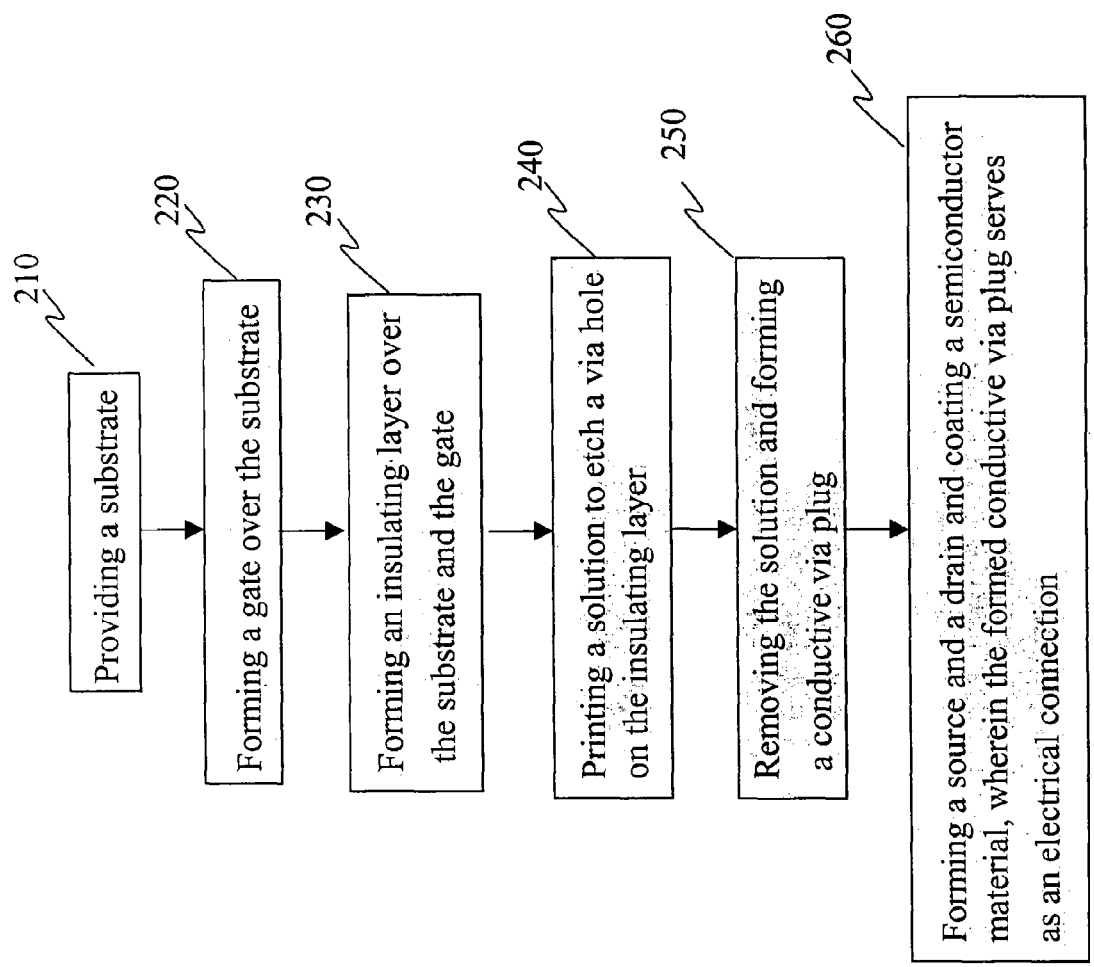
FIG. 12 illustrates a flow chart of an SED method of manufacturing a thin film transistor (TFT) according to the present invention.

Referring to FIG. 12, which depicts a flow chart of manufacturing a thin film transistor (TFT) 50 according to an SED method in the present invention. The SED method comprises the following steps: providing a substrate (step 210); forming a gate over the substrate (step 220); forming an insulating layer over the substrate and the gate (step 230); printing a solution to etch a via hole on the insulating layer (step 240); removing the solution and forming a conductive via plug (step 250); forming a source and a drain and coating a semiconductor material, wherein the formed conductive via plug serves as an electrical connection (step 260). The steps above will be specifically described as follows.

The first step is to provide a substrate. As shown in FIG. 6, a silicon semiconductor substrate 60 is provided.

Next, a gate is formed over the substrate. The gate 62 is formed over a surface of the substrate 60 and an electroless plating chrome is formed the gate 62 to promote a surface flatness of the gate 62, wherein the gate 62 is obtained by printing a sodium tetrachloro-palladate solution and the solution is used as a catalyst for the electroless plating chrome.

An insulating layer is formed on the substrate and the gate. As shown in FIG. 7, a photoacryl organic solution is coated on the substrate 60 and the gate 62 by spin coating. After a 5 minutes soft bake at 90~120° C., the insulating layer 70 is formed, wherein the insulating layer 70 has a preferred thickness of 6000~20000 Å.

The solution is printed and used to etch the insulating layer to form a via hole. As shown in FIG. 8, a solution 80 having an organic solution and conductive material is printed on an upper surface of the insulating layer 70, using a printing method to form the via hole. In the solution, the organic solvent is acetone and anisole, used to etch the insulating layer 70 obtained from the photoacryl organic solution, and the conductive material has nano-paste Ag particles with their diameters not more than 5 micro meters obtained from Harima.

Figure 9:
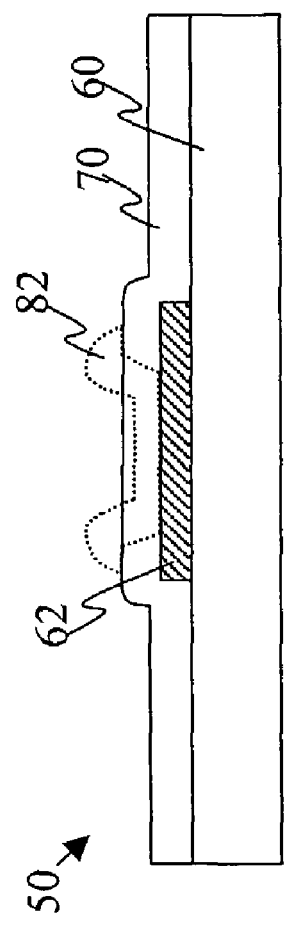

Next, the solvent is removed and a conductive via plug is formed (step 250). In FIG. 9, the conductive via plug 82 is formed, which is the solution 80 after the etch through the insulating material 70, a main bake of 1 hour at 230° C. and a solidification of the conductive material and the insulating layer dissolved. The thus formed insulating layer 70 has a resistivity over 10 times that of the conductive via plug 82.

Figure 10:
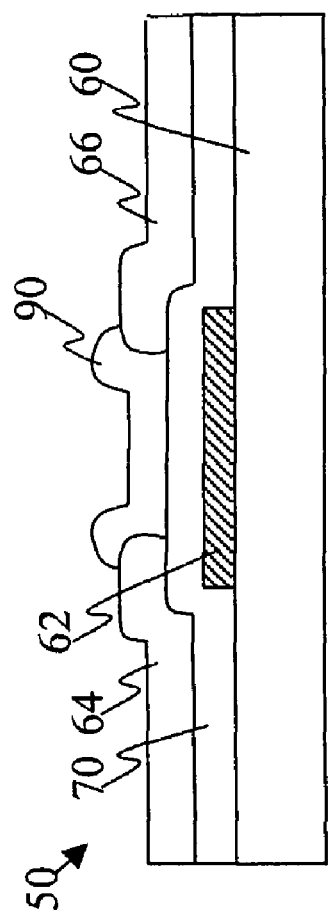

Next, a source and a drain are formed and the conductive via plug is served as an electrical connection (step 260). As shown in FIG. 10, a source 64 and a drain 66 are manufactured and a semiconductor material 90 is deposited to finish a TFT 50. In this case, the conductive via plug 82 serves as an electrical connection between the gate 62 and the source 64 and between the gate 62 and the drain 66.

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a conductive via plug which replaces the deposition-lithography-etching process, and forms a via hole by etching an insulating layer and removing solvent to form a conductive via plug by an inkjet method, comprising the steps of:
    providing a substrate;
    forming a gate over said substrate, wherein the gate is formed by using a tetrachloro-palladate solution;
    forming an insulating layer over said substrate and said gate;
    printing a solution comprising a solvent and a conductive material on an upper surface of said insulating layer by an inkjet method and forming a via hole by etching said insulating layer to expose said gate by said solvent;
    removing said solvent to form a conductive via plug by depositing said conductive material; and
    forming a source and a drain and coating a semiconductor material over said insulating layer and said conductive via plug serving as an electrical connection respectively between said gate and said source and between said gate and said drain.

2. The method of forming a conductive via plug according to claim 1, wherein said insulating layer is an organic insulating layer.

3. The method of forming a conductive via plug according to claim 2, wherein said organic insulating layer is formed by coating an organic solution coated on said first conductive layer and said organic solution comprises an organic solid material in solvent.

4. The method of forming a conductive via plug according to claim 1, wherein said conductive material is made of conductive particles having a diameter not more than 5 micrometers.

5. The method of forming a conductive via plug according to claim 1, further comprising a step of baking said solution by heating after printing said solution on the upper surface of said insulating layer to form said conductive via plug.

6. The method of forming a conductive via plug according to claim 5, wherein said conductive via plug is formed by said conductive material and said insulating layer which is dissolved to form said conductive via plug.

7. A method of forming a conductive via plug, which replaced the deposition-lithography-etching process, forms a via hole by etching an insulating layer and removing solvent to form a conductive via plug by an inkjet method, comprising the steps of:
    providing a substrate;
    forming a gate over said substrate, wherein the gate is formed by using a tetrachioro-palladate solution;
    coating a thin metal film over said gate to enhance a surface flatness of said gate;
    forming an insulating layer over said substrate and said gate;
    printing a solution comprising a solvent and a conductive material on an upper surface of said insulating layer by an inkjet method and forming a via hole by etching said insulating layer to expose said gate by said solvent;
    removing said solvent to form a conductive via plug by depositing said conductive material; and
    forming a source and a drain and coating a semiconductor material over said insulating layer and said conductive via plug serving as an electrical connection respectively between said gate and said source and between said gate and said drain.

8. A method of forming a conductive via plug which replaces the deposition-lithography-etching process, and forms a via hole by etching an insulating layer and removing solvent to form a conductive via plug by an inkjet method, comprising the steps of:
    providing a substrate;
    forming a gate over said substrate, wherein the gate is formed by using a tetrachloro-palladate solution;
    coating a thin metal film over said gate to enhance a surface flatness of said gate.;
    forming an insulating layer over said substrate and said gate;
    printing a solution comprising a solvent and a conductive material on an upper surface of said insulating layer by an inkjet method and forming a via hole by etching said insulating layer to expose said gate by said solvent;
    baking said solution by heating after printing said solution on the upper surface of said insulating layer to form said conductive via plug wherein said conductive via plug is formed by said conductive material and said insulating layer which is dissolved to form said conductive via plug; and
    forming a source and a drain and coating a semiconductor material over said insulating layer and said conductive via plug serving as an electrical connection respectively between said gate and said source and between said gate and said drain wherein said insulating layer has a resistivity of 10 times over said conductive via plug.

* * * * *